(12) United States Patent
Hagihara

(10) Patent No.: US 7,981,217 B2
(45) Date of Patent: Jul. 19, 2011

(54) VERTICAL HEAT TREATMENT APPARATUS AND METHOD OF TRANSFERRING SUBSTRATES TO BE PROCESSED

(75) Inventor: Junichi Hagihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 562 days.

(21) Appl. No.: 12/081,988

(22) Filed: Apr. 24, 2008

(65) Prior Publication Data

US 2008/0264343 A1 Oct. 30, 2008

(30) Foreign Application Priority Data

Apr. 24, 2007 (JP) .................................. 2007-114181

(51) Int. Cl.
  *C23C 16/458* (2006.01)
  *C23C 16/46* (2006.01)
  *C23F 1/00* (2006.01)
  *H01L 21/306* (2006.01)
  *C23C 16/06* (2006.01)
  *C23C 16/22* (2006.01)
(52) U.S. Cl. ............... 118/719; 156/345.31; 156/345.32
(58) Field of Classification Search .................. 118/719; 156/345.31, 345.32
See application file for complete search history.

(56) References Cited

U.S. PATENT DOCUMENTS

| | | | | |
|---|---|---|---|---|
| 5,162,047 | A * | 11/1992 | Wada et al. | 29/25.01 |
| 6,217,663 | B1 * | 4/2001 | Inokuchi et al. | 118/728 |
| 7,181,132 | B2 * | 2/2007 | De Ridder | 392/416 |

| | | | | |
|---|---|---|---|---|
| 2005/0158164 | A1 | 7/2005 | Lee | |
| 2009/0053665 | A1 | 2/2009 | Haraki et al. | |
| 2009/0175705 | A1 * | 7/2009 | Nakao et al. | 414/196 |

FOREIGN PATENT DOCUMENTS

CN 1906748 A 1/2007
(Continued)

OTHER PUBLICATIONS

Japanese Office Action issued on Feb. 24, 2009 with partial English translation.
Chinese Office Action issued on Jul. 13, 2010 for Chinese Application No. 200810092365.6 with English translation.

*Primary Examiner* — Rudy Zervigon
(74) *Attorney, Agent, or Firm* — Smith, Gambrell & Russell, LLP

(57) ABSTRACT

Disclosed herein is a vertical heat treatment apparatus which includes a thermal reactor having a reactor opening, a cover that hermetically closes the reactor opening, a holder that holds a large number of to-be-processed substrates via a ring-shaped support plate in such a manner as to arrange the substrates vertically at predetermined intervals, and an elevator mechanism that loads the holder into and unloads the holder from the thermal reactor. A transfer mechanism has a plurality of transfer plates that are arranged at predetermined intervals to carry to-be-processed substrates, and transfers the to-be-processed substrates between the storage container and the holder. The support plate is divided into an outer support plate and an inner support plate. The outer support plate has a cutout section through which the transfer plates can vertically pass to transfer the to-be-processed substrates. The inner support plate is placed at the inner periphery of the outer support plate and provided with a block section for blocking up the cutout section. Therefore, a plurality of to-be-processed substrates can be transferred at a time to the holder having the ring-shaped support plate. This makes it possible to reduce the transfer time, increase the processing volume, and provide increased throughput.

8 Claims, 6 Drawing Sheets

FOREIGN PATENT DOCUMENTS

| | | |
|---|---|---|
| JP | 5-13547 | 1/1993 |
| JP | 10-70081 | 3/1998 |
| JP | 10-70081 A | 3/1998 |
| JP | 2000-235974 | 8/2000 |
| JP | 2001-44260 | 2/2001 |
| JP | 2003-338531 | 11/2003 |

* cited by examiner

VERTICAL HEAT TREATMENT APPARATUS AND METHOD OF TRANSFERRING SUBSTRATES TO BE PROCESSED

CROSS REFERENCE TO RELATED APPLICATION

This application claims the benefit of Japanese Patent Application No. 2007-114181 filed on Apr. 24, 2007, the content of which is hereby incorporated by reference into this application.

BACKGROUND OF THE INVENTION

1. Field of the Invention

The present invention relates to a vertical heat treatment apparatus and a method of transferring the substrates to be processed, and more particularly to a vertical heat treatment apparatus and a method of transferring the substrates to be processed that make it possible to transfer a plurality of to-be-processed substrates at a time to a holder having a ring-shaped support plate.

2. Description of the Related Art

Semiconductor devices are manufactured by performing various heat treatment processes, such as oxidization, diffusion, CVD, and annealing, on semiconductor wafers or other substrates to be processed. A vertical heat treatment apparatus capable of performing a batch process, that is, thermally processing a large number of wafers at a time, is used as a heat treatment apparatus for performing the above processes.

The vertical heat treatment apparatus includes a thermal reactor, which has a reactor opening at its bottom; a cover, which hermetically closes the reactor opening; a holder (also referred to as a wafer boat), which is positioned above the cover to hold a large number of wafers via a ring-shaped support plate in such a manner as to arrange the wafers vertically at predetermined intervals; an elevator mechanism, which moves the cover up and down to load the holder into and unload the holder from the thermal reactor; and a transfer mechanism, which has a transfer plate (also referred to as a fork) for transferring the wafers between the holder and a storage container (also referred to as a cassette or hoop) that stores a plurality of wafers at predetermined intervals. The ring-shaped support plate is used to inhibit or prevent the generation of a slip (crystal fault) at the periphery of a wafer during a high-temperature thermal process.

An upthrust type transfer mechanism (hereinafter referred to as transfer mechanism A), which includes a main transfer plate 50 and an upthrust transfer plate 51 as shown in FIGS. 10A to 10C, is employed as the transfer mechanism (refer, for instance, to JP-A-5-13547). The main transfer plate 50 is made of a plate-like body having an upper surface that comes into contact with the lower surface of a wafer w. The upthrust transfer plate 51 is made of a plate-like body having three support pins 52 that come into contact with the lower surface of a wafer w on the upper surface thereof.

When a wafer is to be transferred to the holder, the main transfer plate 50, which supports the wafer w, is inserted into a position above a predetermined support plate 15 in the holder 9. Further, the upthrust transfer plate 51 is inserted into a position below the support plate 15 (FIG. 10A). Next, the upthrust transfer plate 51 ascends to lift the wafer w up from the main transfer plate 50, thereby causing the main transfer plate 50 to leave the holder 9 (FIG. 10B). Next, the upthrust transfer plate 51 descends to let the support plate 15 support the wafer w, and then leaves the holder 9 to complete a transfer operation for one wafer (FIG. 10C).

Another known transfer mechanism (hereinafter referred to as transfer mechanism B) includes a plurality of locking members that are locked onto the lower side surface of a wafer periphery to support a wafer while it is hanging down (with its top grasped). Each locking member is allowed to reciprocate between a wafer support position, at which the wafer is supported while it is hanging down, and a wafer release position, at which the locking member moves to a location outside the outer periphery of the wafer to release the supported wafer. Further, each locking member is driven by an actuator to reciprocate between the wafer support position and wafer release position (refer to JP-A-2003-338531).

However, the conventional vertical heat treatment apparatus spends a considerable amount of time in wafer transfer because transfer mechanisms A and B, which have been described above, can transfer one wafer at a time. In addition, the employed transfer mechanism structure requires a long interval (approximately 16 mm) between the holder support plates (this interval may also be referred to as the transfer interval). This imposes a limit on the batch processing volume because the holder can only accommodate up to approximately 50 wafers. It means that the processing volume cannot readily be increased by the use of the conventional vertical heat treatment apparatus. Transfer mechanism A, in particular, transfers one wafer at a time and takes a considerable amount of time to complete a wafer delivery (which involves more than one operation). As a result, the transfer process involves a long period of time, thereby making it impossible to provide increased throughput.

SUMMARY OF THE INVENTION

The present invention has been made in view of the above circumstances. An object of the present invention is to provide a vertical heat treatment apparatus and to-be-processed substrate transfer method that make it possible to transfer a plurality of to-be-processed substrates at a time to a holder having a ring-shaped support plate, reduce the transfer time, increase the processing volume, and provide increased throughput.

In accomplishing the above object, according to a first aspect of the present invention, there is provided a vertical heat treatment apparatus comprising: a thermal reactor which has a reactor opening at a bottom thereof; a cover which hermetically closes the reactor opening; a holder which is positioned above the cover to hold a large number of to-be-processed substrates via a ring-shaped support plate in such a manner as to arrange the substrates vertically at predetermined intervals; an elevator mechanism which moves the cover up and down to load the holder into and unload the holder from the thermal reactor; a storage container which is positioned outside the thermal reactor to store a plurality of to-be-processed substrates at predetermined intervals; and a transfer mechanism which has a plurality of transfer plates that are arranged at predetermined intervals to carry to-be-processed substrates thereon, the transfer mechanism transferring the to-be-processed substrates between the storage container and the holder; wherein the support plate for the holder is divided into an outer support plate and an inner support plate, the outer support plate having a cutout section through which the transfer plates can vertically pass to transfer the to-be-processed substrates, the inner support plate being placed at the inner periphery of the outer support plate and provided with a block section for blocking up the cutout section.

In the above aspect, the inside diameter of the outer support plate and the outside diameter of the inner support plate are preferably smaller than the diameter of the to-be-processed substrates. Further, the transfer mechanism preferably transfers the to-be-processed substrates while the transfer plates support the to-be-processed substrates via the inner support plate. Furthermore, the transfer plates preferably have a vacuum hole for air suction in a surface thereof. Moreover, the inner support plate preferably includes a vacuum retainer that attaches the to-be-processed substrates to the inner support plate by allowing the vacuum hole in the transfer plates to provide air suction.

The inner support plate may include a circular section, which is placed at the inner periphery of the outer support plate, and a block section, which is integral with the circular section and fits into the cutout section of the outer support plate. Further, a first shoulder section may be formed at the inner periphery of the outer support plate to receive the outer periphery of the inner support plate. In this instance, a second shoulder section may be formed at the outer periphery of the inner support plate to engage with the first shoulder section of the outer support plate.

According to a second aspect of the present invention, there is provided a vertical heat treatment apparatus comprising: a thermal reactor which has a reactor opening at a bottom thereof; a cover which hermetically closes the reactor opening; a holder which is positioned above the cover to hold a large number of to-be-processed substrates via a ring-shaped support plate in such a manner as to arrange the substrates vertically at predetermined intervals; an elevator mechanism which moves the cover up and down to load the holder into and unload the holder from the thermal reactor; a storage container which is positioned outside the thermal reactor to store a plurality of to-be-processed substrates at predetermined intervals; and a transfer mechanism which has a plurality of transfer plates that are arranged at predetermined intervals to carry to-be-processed substrates thereon, the transfer mechanism transferring the to-be-processed substrates between the storage container and the holder; wherein the support plate for the holder is divided into a support plate main body and a block plate, the main body having a cutout section through which the transfer plates can vertically pass to transfer the to-be-processed substrates, the block plate blocking up the cutout section of the support plate main body.

According to a third aspect of the present invention, there is provided a to-be-processed substrate transfer method for transferring to-be-processed substrates in a vertical heat treatment apparatus, the apparatus comprising: a thermal reactor which has a reactor opening at a bottom thereof; a cover which hermetically closes the reactor opening; a holder which is positioned above the cover to hold a large number of to-be-processed substrates via a ring-shaped support plate in such a manner as to arrange the substrates vertically at predetermined intervals; an elevator mechanism which moves the cover up and down to load the holder into and unload the holder from the thermal reactor; a storage container which is positioned outside the thermal reactor to store a plurality of to-be-processed substrates at predetermined intervals; and a transfer mechanism which has a plurality of transfer plates that are arranged at predetermined intervals to carry to-be-processed substrates thereon, the transfer mechanism transferring the to-be-processed substrates between the storage container and the holder; wherein the support plate for the holder is divided into an outer support plate and an inner support plate, the outer support plate having a cutout section through which the transfer plates can vertically pass to transfer the to-be-processed substrates, the inner support plate being placed at the inner periphery of the outer support plate and provided with a block section for blocking up the cutout section, the method comprising the step: transferring the to-be-processed substrates while the transfer mechanism causes the transfer plates to support the to-be-processed substrates via the inner support plate.

According to a fourth aspect of the present invention, there is provided a to-be-processed substrate transfer method for transferring to-be-processed substrates in a vertical heat treatment apparatus, the apparatus comprising: a thermal reactor which has a reactor opening at a bottom thereof; a cover which hermetically closes the reactor opening; a holder which is positioned above the cover to hold a large number of to-be-processed substrates via a ring-shaped support plate in such a manner as to arrange the substrates vertically at predetermined intervals; an elevator mechanism which moves the cover up and down to load the holder into and unload the holder from the thermal reactor; a storage container which is positioned outside the thermal reactor to store a plurality of to-be-processed substrates at predetermined intervals; and a transfer mechanism which has a plurality of transfer plates that are arranged at predetermined intervals to carry to-be-processed substrates thereon, the transfer mechanism transferring the to-be-processed substrates between the storage container and the holder; wherein the support plate for the holder is divided into a support plate main body and a block plate, the main body having a cutout section through which the transfer plates can vertically pass to transfer the to-be-processed substrates, the block plate blocking up the cutout section of the support plate main body, the method comprising the step: transferring the to-be-processed substrates while the transfer mechanism causes the transfer plates to support the to-be-processed substrates in coordination with the block plate.

According to the first aspect of the present invention, the support plate for the holder is divided into the outer support plate, which has a cutout section through which the transfer plates can vertically pass to transfer the to-be-processed substrates, and the inner support plate, which is placed at the inner periphery of the outer support plate and provided with a block section for blocking up the cutout section. Therefore, the transfer mechanism having a plurality of transfer plates can transfer a plurality of to-be-processed substrates at a time to the holder having the ring-shaped support plate. This makes it possible to reduce the transfer time, increase the processing volume, and provide increased throughput.

According to the second aspect of the present invention, the support plate for the holder is divided into the support plate main body, which has a cutout section through which the transfer plates can vertically pass to transfer to-be-processed substrates, and the block plate, which blocks up the cutout section of the support plate main body. Therefore, the transfer mechanism having a plurality of transfer plates can transfer a plurality of to-be-processed substrates at a time to the holder having the ring-shaped support plate. This makes it possible to reduce the transfer time, increase the processing volume, and provide increased throughput.

According to the third aspect of the present invention, the support plate for the holder is divided into the outer support plate, which has a cutout section through which the transfer plates can vertically pass to transfer to-be-processed substrates, and the inner support plate, which is placed at the inner periphery of the outer support plate and provided with a block section for blocking up the cutout section. Further, the transfer mechanism transfers the to-be-processed substrates while the transfer plates support the to-be-processed substrates via the inner support plate. Therefore, a plurality of to-be-processed substrates can be transferred at a time to the holder having the ring-shaped support plate. This makes it possible to reduce the transfer time, increase the processing volume, and provide increased throughput.

According to the fourth aspect of the present invention, the support plate for the holder is divided into the support plate main body, which has a cutout section through which the transfer plates can vertically pass to transfer to-be-processed substrates, and the block plate, which blocks up the cutout section of the support plate main body. Further, the transfer mechanism transfers the to-be-processed substrates while the transfer plates support the to-be-processed substrates in coordination with the block plate. Therefore, a plurality of to-be-processed substrates can be transferred at a time to the holder having the ring-shaped support plate. This makes it possible to reduce the transfer time, increase the processing volume, and provide increased throughput.

DETAILED DESCRIPTION OF THE PREFERRED EMBODIMENTS

Figure 1:
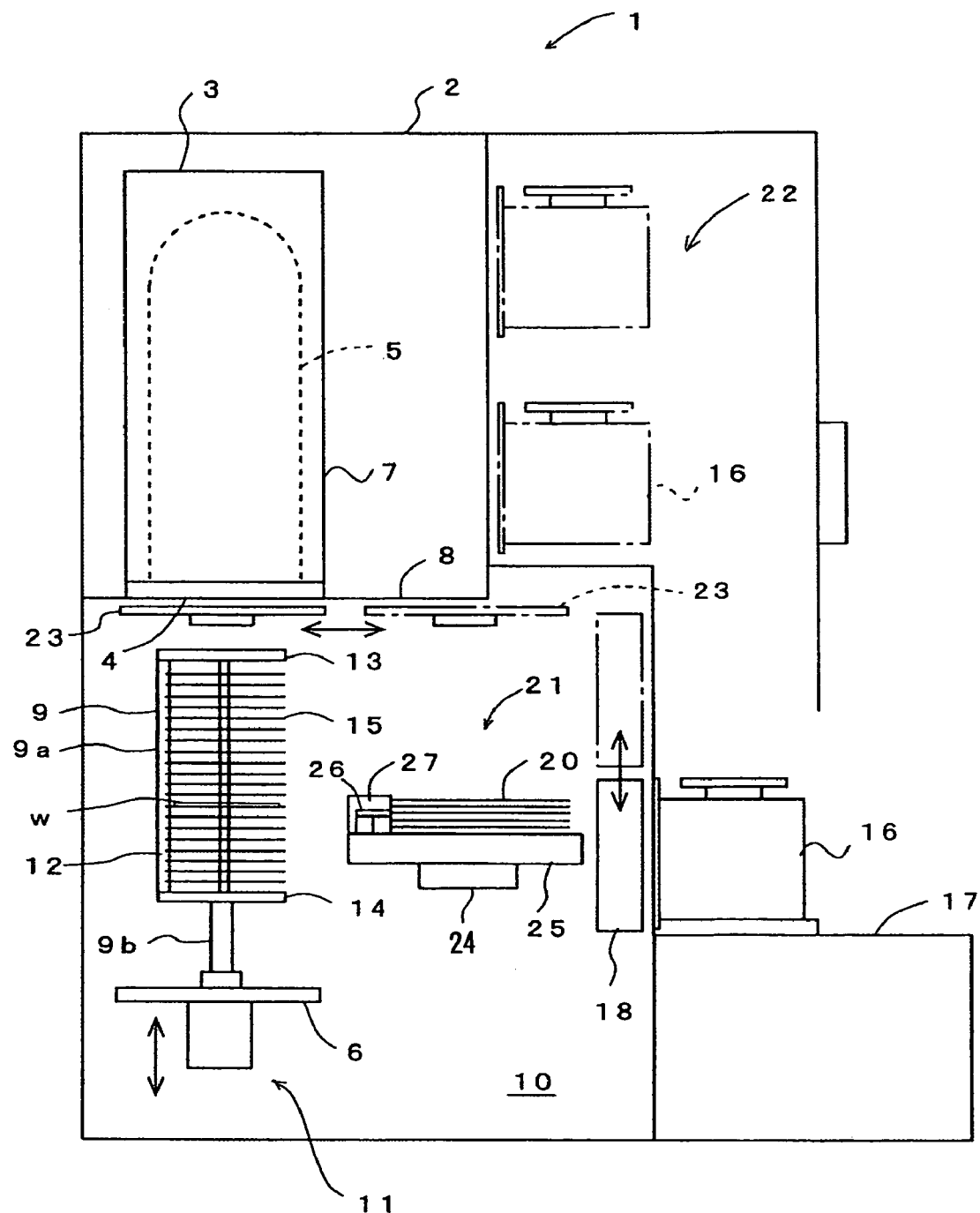
FIG. 1 is a vertical cross-sectional view that schematically shows a vertical heat treatment apparatus according to an embodiment of the present invention.
Figure 2:
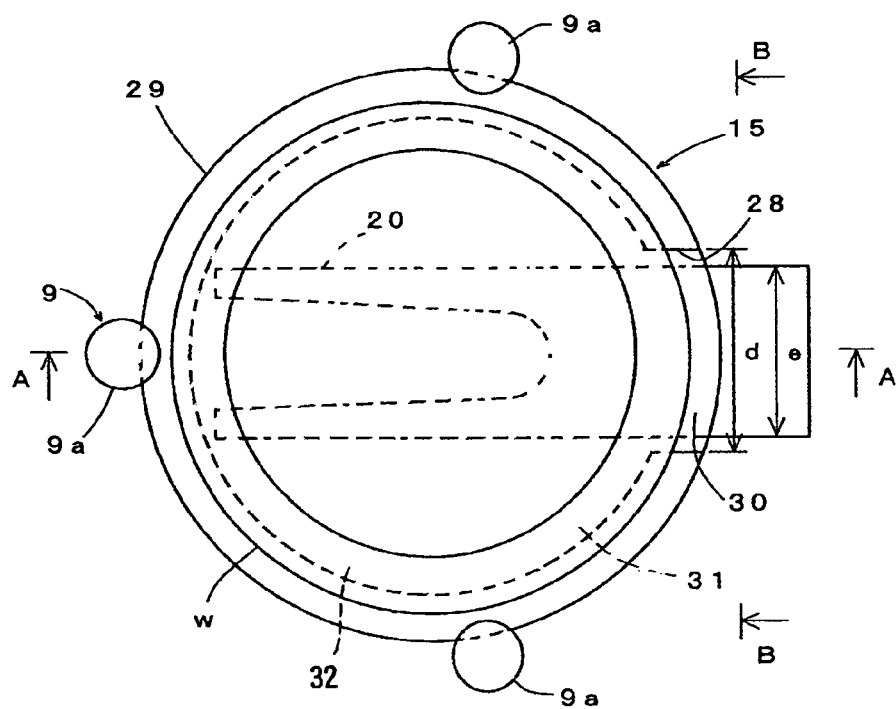
FIG. 2 is a horizontal cross-sectional view that schematically shows a substrate holder.
Figure 3:
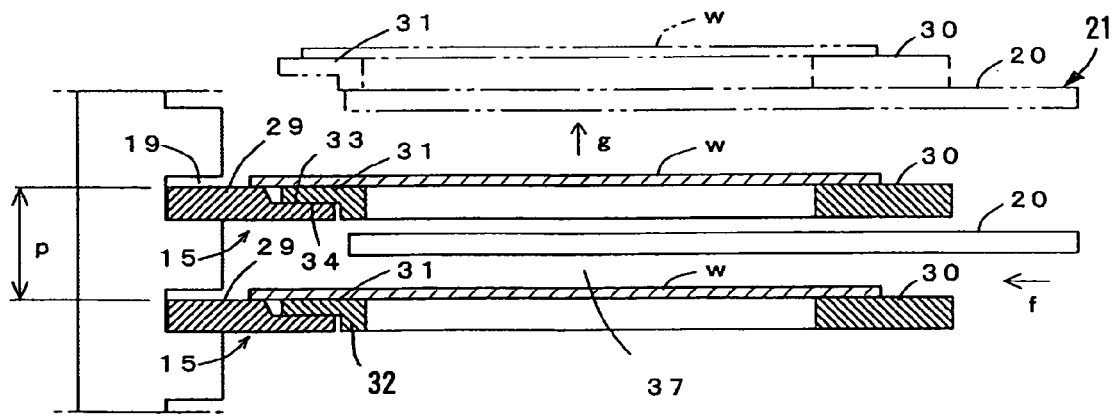
FIG. 3 is an enlarged cross-sectional view taken along line A-A of FIG. 2.
Figure 4:
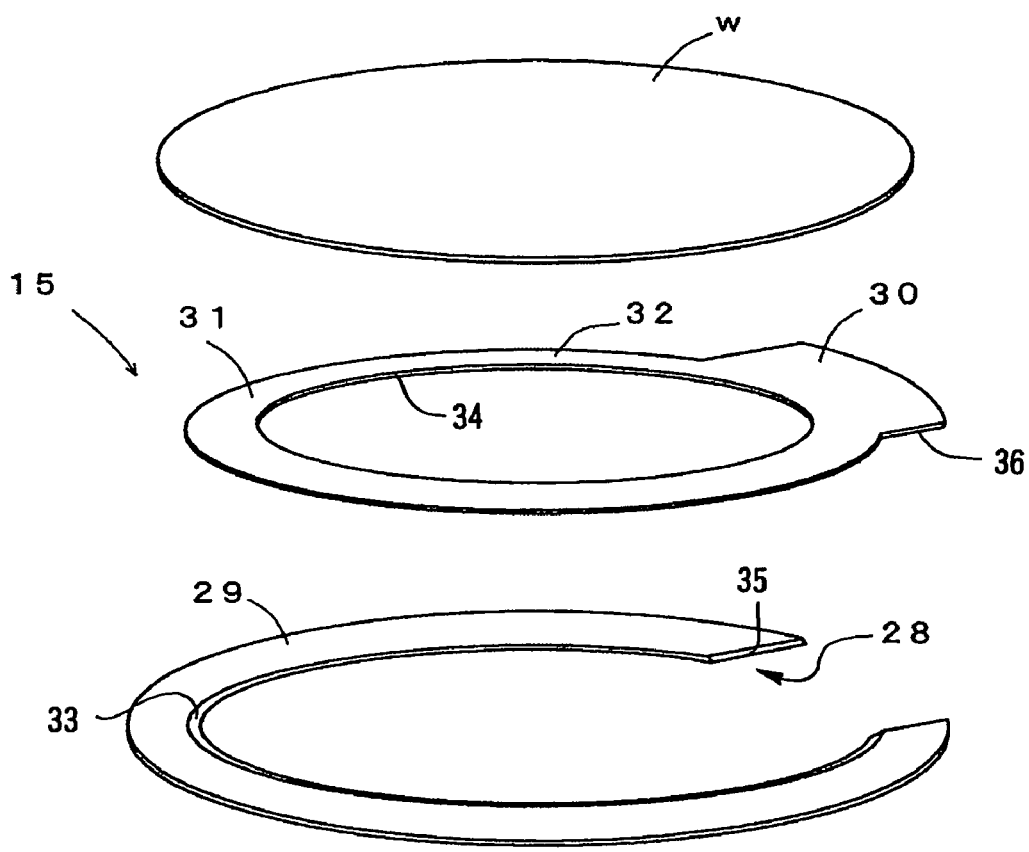
FIG. 4 is an exploded perspective view of a support plate.

An embodiment of the present invention will now be described with reference to the accompanying drawings. FIG. 1 is a vertical cross-sectional view that schematically shows a vertical heat treatment apparatus according to an embodiment of the present invention. FIG. 2 is a horizontal cross-sectional view that schematically shows a substrate holder. FIG. 3 is an enlarged cross-sectional view taken along line A-A of FIG. 2. FIG. 4 is an exploded perspective view of a support plate.

As shown in FIG. 1, the vertical heat treatment apparatus 1 has a housing 2, which forms an enclosure. A vertical thermal reactor 3 is positioned in an upper section within the housing 2 to receive disk-shaped thin wafers or other to-be-processed substrates and perform a CVD or other predetermined process on them. The thermal reactor 3 includes a reaction tube 5, which is made of quartz, or other vertically long processing storage container having a reactor opening 4 opened at its bottom, and a heater (heating mechanism) 7, which is installed to enclose the reaction tube 5 and provide heating control to maintain a predetermined temperature, for instance, between 300 and 1200 C within the reaction tube 5. Further, a cover 6 is positioned below the thermal reactor 3. This cover 6 can move up and down to open and close the reactor opening 4 in the reaction tube 5.

A base plate 8, which is made, for instance, of stainless steel, is horizontally positioned within the housing 2 to permit the installation of the reaction tube 5 and heater 7, which constitute the thermal reactor 3. The base plate 8 has an opening (not shown) that permits the upward insertion of the reaction tube 5.

An outward flange section is formed at the lower end of the reaction tube 5. Since the flange section is secured to the base plate 8 via a flange holding member, the reaction tube 5 is installed by inserting it upward through the opening in the base plate 8. The reaction tube 5 can be removed downward from the base plate 8 for cleaning or other purpose. The reaction tube 5 is connected to a plurality of gas introduction tubes (not shown), which introduce a process gas and purging inert gas into the reaction tube 5; a vacuum pump (not shown), which can exercise decompression control over the interior of the reaction tube 5; and an exhaust tube (not shown) having a pressure regulating valve and the like.

Within the housing 2, a work area (loading area) 10 is provided below the base plate 8 and used to load the holder (boat) 9, which is installed above the cover 6, into the thermal reactor 3 (more specifically, the reaction tube 5), unload the holder (boat) 9 from the thermal reactor 3, or transfer a wafer w to the holder 9. The work area 10 is provided with an elevator mechanism 11, which moves the cover 6 up and down for the holder 9 (boat) to be loaded and unloaded. The cover 6 comes into contact with the open end of the reactor opening 4 and hermetically closes the reactor opening 4. A rotation mechanism (not shown) is installed below the cover 6 to rotate the holder 9.

The holder 9 exemplified in the figure is made, for instance, of quartz. The holder 9 includes a main body section 9a and a foot section 9b. The main body section 9a simultaneously supports a large number of wafers w (e.g., 100 to 130 wafers) having a diameter as large as, for instance, 300 mm in a horizontal position via a ring-shaped support plate 15, which will be described later, while the wafers are vertically arranged at predetermined intervals p (e.g., at intervals of approximately 6 mm). The foot section 9b supports the main body section 9a. The foot section 9b is connected to a rotation shaft of the aforementioned rotation mechanism. A lower heating mechanism (not shown) is installed between the main body section 9a and cover 6 to avoid a temperature drop that may be caused by heat dissipation from the reactor opening 4. Alternatively, the holder 9 may include the main body section 9a only and exclude the foot section 9b, and may be placed above the cover 6 with a thermal insulation tube positioned in between. The holder 9 includes a plurality of stanchions 12 (e.g., three stanchions); a roof plate 13 and a bottom plate 14, which are placed at the upper or lower end of the stanchions 12; and a multistage, ring-shaped support plate 15, which engage with grooves 19 made in the stanchions 12 at predetermined intervals. The structure of the support plate 15 will be described in detail later.

A mounting base (load port) 17 is installed in front of the housing 2 (placed opposite the thermal reactor 3). The mounting base 17 receives a storage container 16 (also referred to as a cassette or hoop) that stores a plurality of wafers w (e.g., approximately 25 wafers w) at predetermined intervals, and loads the storage container 16 into and unloads the storage container 16 from the housing 2. The storage container 16, which is positioned outside of the thermal reactor 3, is a hermetic type storage container having a detachable cover (not shown) at its front. A door mechanism 18 is installed on the side toward the mounting base 17 within the work area 10. The door mechanism 18 uncovers the storage container 16 to let the storage container 16 communicate with the work area 10. The work area 10 is also provided with a transfer mechanism 21 having a plurality of transfer plates (forks) 20, which are positioned at predetermined intervals to transfer wafers w between the storage container 16 and holder 9.

A storage shelf section 22 and a conveyor mechanism (not shown) are positioned in an upper front section outside the work area 10. The storage shelf section 22 stocks the storage container 16. The conveyor mechanism conveys the storage container 16 from the mounting base 17 to the storage shelf section 22 or from the storage shelf section 22 to the mounting base 17. A shutter mechanism 23 is installed over the work area 10. The shutter mechanism 23 covers (or blocks up) the reactor opening 4 to inhibit or prevent the heat within a high-temperature reactor from being released from the reactor opening 4 to the work area 10 below when the cover 6 is opened.

The aforementioned transfer mechanism 21 includes a plurality of transfer plates 20 (e.g., five transfer plates), which support a plurality of wafers w (e.g., five wafers w) while vertically arranging them at predetermined intervals. It is assumed that the central transfer plate (third transfer plate) can independently advance and retract in a forward direction. It is also assumed that an interval change mechanism (not shown) can continuously vary the intervals at which the other transfer plates (the first, second, fourth, and fifth transfer plates) are vertically arranged with reference to the central transfer plate. The reason is that the intervals at which the wafers are stored in the storage container 16 may differ from the intervals at which the wafers are positioned within the holder 9. Even when these intervals do not match, the interval change mechanism operates as needed to transfer a plurality of wafers w at a time between the storage container 16 and holder 9.

The transfer mechanism 21 includes an elevator arm 24 and a box-shaped base 25. The elevator arm 24 can move up and down. The base 25 is attached to the elevator arm 24 and allowed to pivot horizontally. The base 25 is provided with a first movable body 26 and a second movable body 27, which are arranged in a longitudinal direction of the base 25 and allowed to advance and retract. The first movable body 26 can move the central transfer plate 20 forward. The second movable body 27 can move the remaining four transfer plates 20 forward (it should be noted that two of these transfer plates are positioned above the central transfer plate 20 while the remaining two transfer plates are positioned below the central transfer plate 20). The use of the above configuration makes it possible to transfer one wafer at a time (single wafer transfer) by moving the first movable body 26 only and simultaneously transfer a plurality of wafers, for instance, five wafers (multiple wafer transfer) by moving both the first and second movable bodies 26, 27. A movement mechanism (not shown) is built in the base 25 to move the first and second movable bodies 26, 27. The movement mechanism and interval change mechanism described, for instance, in JP-A-2001-44260 are employed as the aforementioned movement mechanism and interval change mechanism.

The transfer plates 20 are vertically long, thin plates made of alumina ceramic and approximately 2 mm in thickness. It is preferred that the transfer plates 20 be substantially U-shaped, planar plates with two prongs at their ends (see FIG. 2). One leading end of a transfer plate 20 may have a sensor head for a mapping sensor that permits the input and output of infrared light. The other leading end of the transfer plate 20 may have a reflecting mirror that reflects infrared light emitted from the sensor head of the mapping sensor and causes the sensor head of the mapping sensor to receive the reflected light. When the infrared light is intercepted by a to-be-detected object while the transfer mechanism 21 moves for teaching purposes, the location of the to-be-detected object is detected.

As shown in FIGS. 2 to 4, the support plate 15 for the holder 9 is divided into an outer support plate (outer ring) 29, which has an cutout section 28 through which the transfer plates 20 can vertically pass to transfer wafers w, and an inner support plate (inner ring) 31, which is placed at the inner periphery of the outer support plate 29 and provided with a block section 30 for blocking up the cutout section 28. In other words, the support plate 15 is composed of the outer support plate 29 and inner support plate 31. The outer support plates 29 are substantially C-shaped, planar plates, and horizontally attached to a stanchion 9a of the holder 9 while they are vertically arranged at predetermined intervals p. The width d of the cutout section 28 is greater than the width e of the transfer plate.

The inner support plate 31 includes a circular section 32, which is placed at the inner periphery of the outer support plate 29, and a block section 30, which is integral with the circular section 32 and fits into the cutout section 28 of the outer support plate 29 (see FIG. 4). A positioning concave section (shoulder section) 33 is preferably formed on the upper surface of the inner periphery of the outer support plate 29 to receive the outer periphery of the circular section 32 of inner support plate 31. Further, a concave section (shoulder section) 34 is preferably formed on the lower surface of the outer periphery of the inner support plate 31. In this instance, engaging the concave section (shoulder section) 33 of the outer support plate 29 with the concave section (shoulder section) 34 of the inner support plate 31 decreases the thickness of an overlap between the inner support plate 31 and outer support plate 29.

Figure 5:
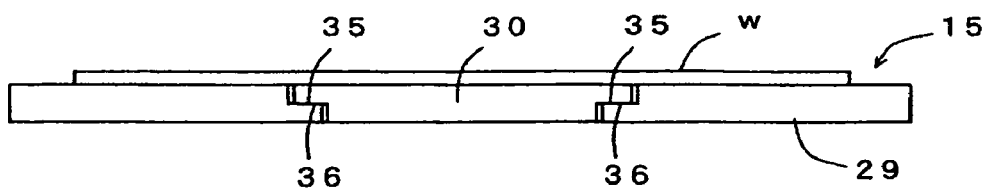
FIG. 5 is a view taken along line B-B of FIG. 2.

For the same reason as described above, a positioning concave section (shoulder section) 35 is preferably formed on the upper surface of the edge of the cutout section 28 to receive the edge of the block section 30 as shown in FIG. 5. Further, a concave section (shoulder section) 36 is preferably formed on the lower surface of the edge of the block section 30. The above-mentioned concave sections (shoulder sections) 33, 34, 35, 36 may be formed into a tapered shape (see FIG. 4). The outer support plate 29 is approximately 2 to 2.5 mm in thickness. Likewise, the inner support plate 31 is approximately 2 to 2.5 mm in thickness. Since the outer support plate 29 overlaps with the inner support plate 31 as shown in FIG. 3, the overall thickness of the support plate 15 is as small as approximately 2 to 2.5 mm.

When a wafer w is to be transferred to the support plate 15 of the holder 9, the periphery of the wafer w is preferably placed on the upper surface of the outer support plate 29. When a wafer w is to be transferred to the storage container 16, the inside diameter of the outer support plate 29 and the outside diameter of the inner support plate 31 are preferably smaller than the diameter of the wafer w so that the periphery of the wafer w fits into the storage groove (not shown), which is formed on both sides within the storage container 16 and vertically arranged at predetermined intervals.

The operation performed to transfer a wafer w from the holder 9 to the storage container 16 will now be described. In this instance, the transfer mechanism 21 first advances the transfer plate 20 (in the direction of arrow f) from the front of the holder 9 (from the front of the cutout section 28 of the outer support plate 29) and inserts it into a gap 37 between the upper and lower support plates 15 as shown in FIG. 3. Next, the transfer mechanism 21 moves the transfer plate 20 upward (in the direction of arrow g) to let the transfer plate 20 support the wafer w via the inner support plate 31 as indicated by the phantom line. The transfer mechanism 21 then carries the wafer w into the storage container 16 while it is supported in the above manner. Subsequently, the transfer mechanism 21 returns the inner support plate 31 on the transfer plate 20 to a position above the outer support plate 29.

The operation performed to transfer a wafer w from the storage container 16 to the holder 9 will now be described. In this instance, the transfer plate 20 of the transfer mechanism 21 first accesses the inner support plate 31 of the holder 9. The transfer mechanism 21 then moves toward the storage container 16 with the inner support plate 31 placed on the transfer plate 20. Next, the transfer mechanism 21 accesses a wafer w in the storage container 16, places the wafer w on the inner support plate 31, and removes the wafer w from the storage container 16. Subsequently, the transfer mechanism 21 transfers the wafer w and inner support plate 31 to a position above the outer support plate 29 of the holder 9.

The operation of the transfer mechanism 21 in the vertical heat treatment apparatus 1, which is configured as described above, and the transfer method employed by the vertical heat treatment apparatus 1 will now be described in detail. When a wafer w is to be transferred from the storage container 16 to the holder 9, the transfer mechanism 21 first inserts the transfer plate 20 into a gap between the upper and lower support plates 15 in the holder 9 and lifts the transfer plate 20 to move the inner support plate 31, which is placed on the outer support plate 29, to a position above the transfer plate 20. In the resulting state, the transfer mechanism 21 inserts the transfer plate 20 into the storage container 16, causes the transfer plate 20 to support the wafer w via the inner support plate 31, and removes the wafer w from the storage container 16. In the resulting state, the transfer mechanism 21 inserts the transfer plate 20 into a gap between the upper and lower support plates 15 in the holder 9 and lowers the transfer plate 20 to transfer the wafer w and inner support plate 31 to a position above the outer support plate 29. After the wafer w is completely transferred to (placed in) the holder 9 as described above, the holder 9 is loaded into the thermal reactor 3 to perform a predetermined thermal process on the wafer w. When an operation is performed after completion of the thermal process to unload the holder 9 from the thermal reactor 3, transport the holder 9 to the work area 10, and transfer the wafer w from the holder 9 to the storage container 16, the transfer mechanism 21 moves the transfer plate 20 by reversing the procedure described above.

As described above, the vertical heat treatment apparatus 1 is configured so that the support plate 15 of the holder 9 is divided into the outer support plate 29, which has the cutout section 28 through which the transfer plate 20 of the transfer mechanism 21 can vertically pass to transfer a to-be-processed substrate w, and the inner support plate 31, which is placed at the inner periphery of the outer support plate 29 and provided with the block section 30 for blocking up the cutout section 28. Therefore, one or a plurality of transfer plates 20 (e.g., five transfer plates) can operate once to complete a transfer operation. This makes it possible to transfer a plurality of wafers w (e.g., five wafers w) at a time to the holder 9 having the ring-shaped support plates 15. Consequently, the transfer time can be considerably reduced to provide increased throughput. Further, since the transfer mechanism 21 described above can perform a transfer operation, the intervals p at which the ring-shaped support plates 15 of the holder 9 are arranged can be decreased to approximately 6 mm although the conventional intervals were approximately 16 mm. As a result, the processing volume can be increased to approximately 100 to 130 wafers, that is, 2 to 2.6 times the conventional processing volume, which is approximately 50 wafers.

Figure 6:
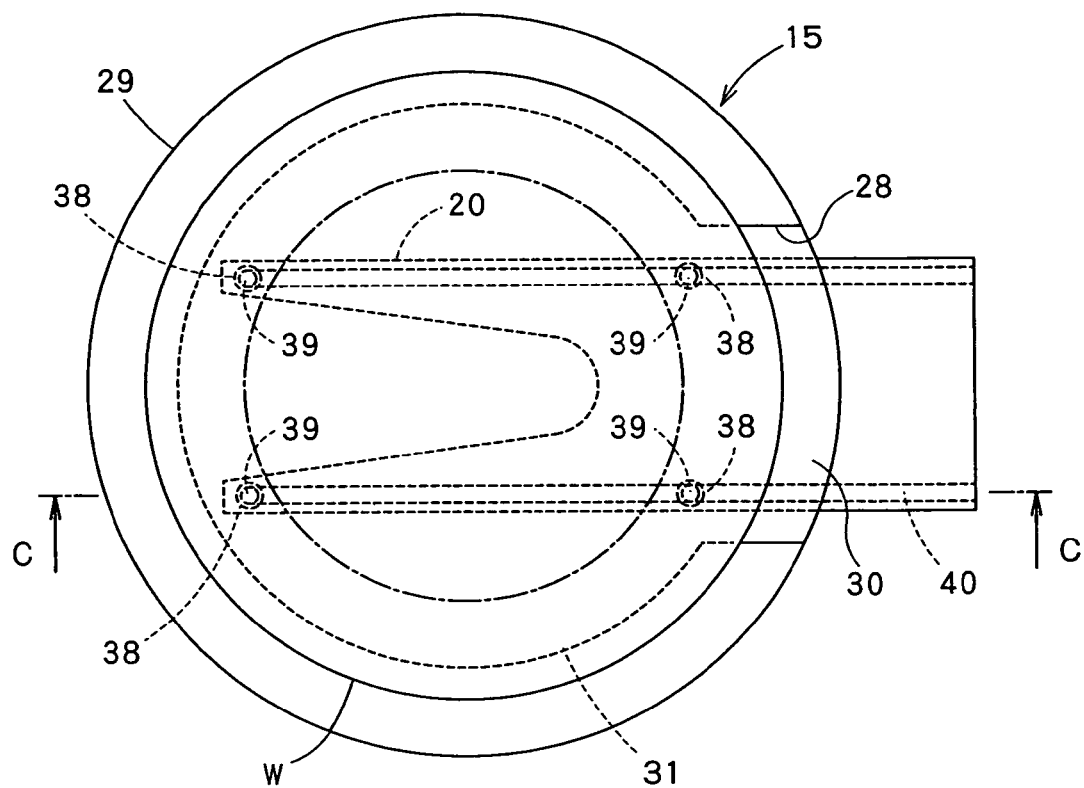
FIG. 6 is a schematic plan view showing a modified example of a transfer plate.
Figure 7:
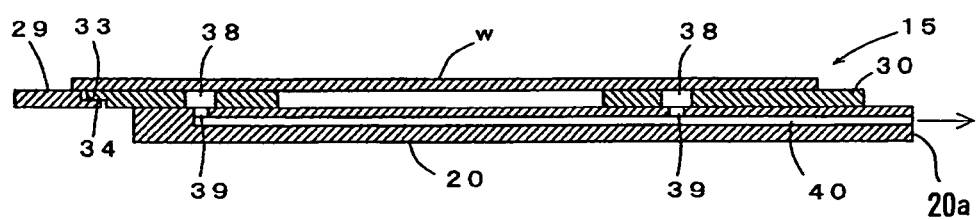
FIG. 7 is a cross-sectional view taken along line C-C of FIG. 6.

A modified embodiment of the present invention will now be described with reference to FIGS. 6 and 7. FIG. 6 is a schematic plan view showing a modified example of the transfer plate. FIG. 7 is a cross-sectional view taken along line C-C of FIG. 6. Elements identical with the counterparts described in conjunction with the embodiment described with reference to FIGS. 1 to 5 are assigned the same reference numerals as their counterparts and will not be described again.

Referring to FIGS. 6 and 7, the inner support plate 31 has a plurality of vacuum retainers (vacuum retention pockets) that attach a wafer w to the inner support plate 31 by providing air suction from the side toward the transfer plate 20. Each vacuum retainer 38 is formed so as to vertically penetrate through the inner support plate 31. Further, the transfer plate 20 is provided with, in a surface thereof, a plurality of vacuum holes 39 that communicate with the vacuum retainers 38 of the inner support plate 31 to provide air suction. Each vacuum hole 39 in the transfer plate 20 is placed at a position that corresponds to that of each vacuum retainer 38 of the inner support plate 31. A vacuum path 40 is formed inside the transfer plate 20 to establish communication between a base end 20a and vacuum holes 39. The vacuum path 40 is connected to a vacuum pump (not shown), which serves as a vacuum source, via a suction tube (not shown). The modified embodiment shown in FIGS. 6 and 7 allows the transfer plate 20 to vacuum-retain wafers w via the inner support plate 31. This makes it possible to properly prevent the wafers w from dropping off during a transfer.

Figure 8:
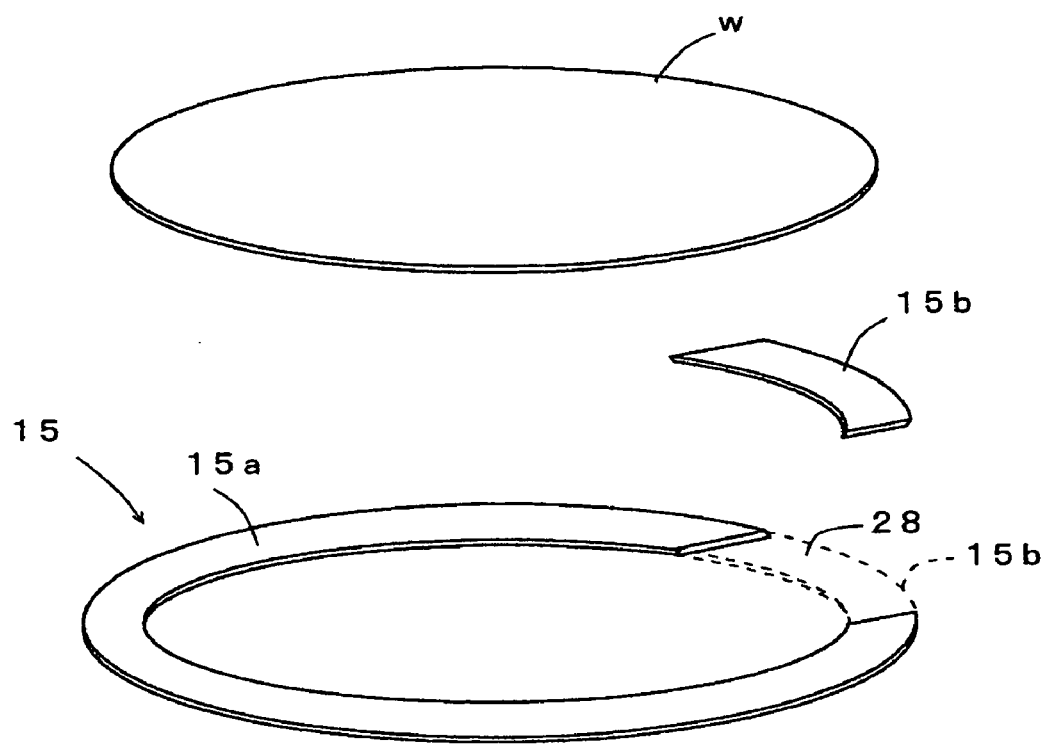
FIG. 8 is a perspective view showing a modified example of the support plate.
Figure 9:
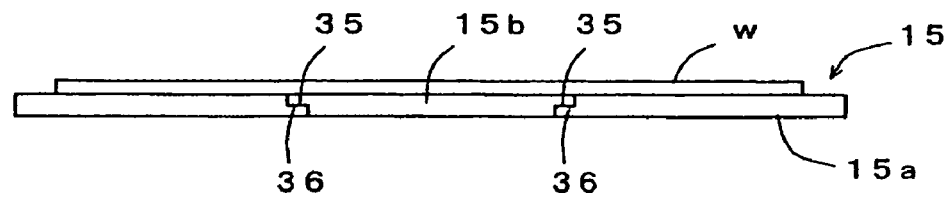
FIG. 9 is a front view showing a wafer placed on the support plate shown in FIG. 8.
Figure 10A:
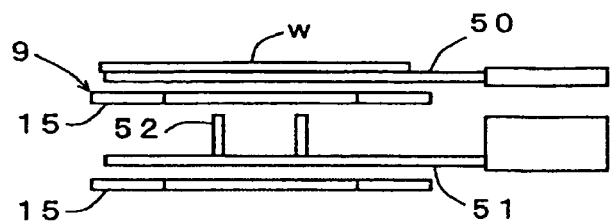
FIGS. 10A to 10C depict an example of a transfer mechanism in a conventional vertical heat treatment apparatus.
Figure 10B:
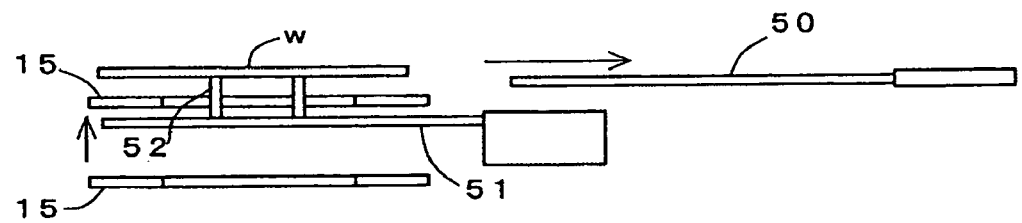
Figure 10C:
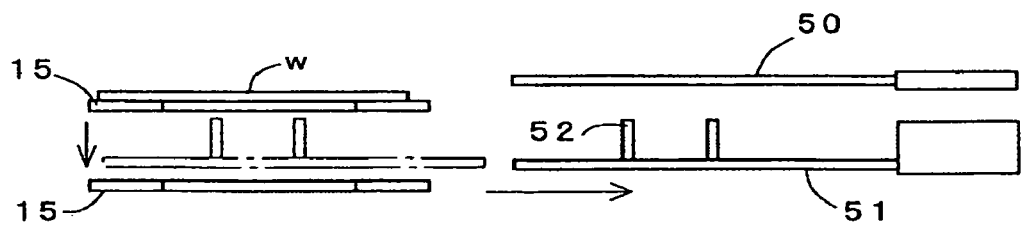

Another modified embodiment of the present invention will now be described. FIG. 8 is a perspective view showing a modified example of the support plate. FIG. 9 is a front view showing a wafer placed on the support plate shown in FIG. 8. Elements identical with the counterparts described in conjunction with the embodiment described with reference to FIGS. 1 to 5 are assigned the same reference numerals as their counterparts and will not be described again.

Referring to FIGS. 8 and 9, the support plate 15 is divided into a support plate main body 15a, which has a cutout section 28 through which the transfer plates 20 can vertically pass to transfer wafers w, and a block plate 15b, which blocks up the cutout section 28 of the support plate main body 15a. In this instance, as shown in FIG. 9, a positioning concave section (shoulder section) 35 is preferably formed on the upper surface of the edge of the cutout section 28 to receive the block plate 15b while a concave section (shoulder section) 36 is also formed on the lower surfaces of edges on both ends of the block plate 15b. These concave sections (shoulder sections) 35, 36 may be formed into a tapered shape.

A wafer transfer operation should be performed so that the transfer plate 20 transfers a wafer w while supporting it in coordination with the block plate 15b. In this instance, the base end of the transfer plate 20 supports one end of the wafer w via the block plate 15b while the leading end of the transfer plate 20 supports the other end of the wafer w. The transfer plate 20 may include a vacuum retainer that directly retains a wafer w by suction at the leading end of the transfer plate 20 and retains the wafer w by suction at the base end of the transfer plate 20 via the block plate 15b. The modified embodiment shown in FIGS. 8 and 9 provides the same advantages as the embodiment shown in FIGS. 1 to 5.

While various preferred embodiments of the present invention have been described in detail above with reference to the accompanying drawings, it should be understood that the invention is not limited to those preferred embodiments. It will be apparent to persons skilled in the relevant arts that design changes and various other modifications can be made therein without departing from the spirit and scope of the present invention.

What is claimed is:

1. A vertical heat treatment apparatus comprising:
   a thermal reactor which has a reactor opening at a bottom thereof;
   a cover which hermetically closes the reactor opening;
   a holder which is positioned above the cover to hold a large number of to-be-processed substrates via a ring-shaped support plate in such a manner as to arrange the substrates vertically at predetermined intervals;
   an elevator mechanism which moves the cover up and down to load the holder into and unload the holder from the thermal reactor;
   a storage container which is positioned outside the thermal reactor to store a plurality of to-be-processed substrates at predetermined intervals; and
   a transfer mechanism which has a plurality of transfer plates that are arranged at predetermined intervals to carry to-be-processed substrates thereon, the transfer mechanism transferring the to-be-processed substrates between the storage container and the holder;
   wherein the support plate for the holder is divided into an outer support plate and an inner support plate which are formed separately from each other, the outer support plate being formed substantially C-shaped having a cutout section through which the transfer plates can vertically pass to transfer the to-be-processed substrates, the inner support plate being placed at the inner periphery of the outer support plate and provided with a block section for blocking up the cutout section.

2. The vertical heat treatment apparatus according to claim 1,
   wherein the inside diameter of the outer support plate and the outside diameter of the inner support plate are smaller than the diameter of the to-be-processed substrates.

3. The vertical heat treatment apparatus according to claim 1,
   wherein the transfer mechanism transfers the to-be-processed substrates while the transfer plates support the to-be-processed substrates via the inner support plate.

4. The vertical heat treatment apparatus according to claim 1,
   wherein the transfer plates has a vacuum hole for air suction in a surface thereof; and
   wherein the inner support plate includes a vacuum retainer that attaches the to-be-processed substrates to the inner support plate by allowing the vacuum hole in the transfer plates to provide air suction.

5. The vertical heat treatment apparatus according to claim 1,
   wherein the inner support plate includes a circular section, which is placed at the inner periphery of the outer support plate, and a block section, which is integral with the circular section and fits into the cutout section of the outer support plate.

6. The vertical heat treatment apparatus according to claim 1,
   wherein a first shoulder section is formed at the inner periphery of the outer support plate to receive the outer periphery of the inner support plate.

7. The vertical heat treatment apparatus according to claim 6,
   wherein a second shoulder section is formed at the outer periphery of the inner support plate to engage with the first shoulder section of the outer support plate.

8. A vertical heat treatment apparatus comprising:
   a thermal reactor which has a reactor opening at a bottom thereof;
   a cover which hermetically closes the reactor opening;
   a holder which is positioned above the cover to hold a large number of to-be-processed substrates via a ring-shaped support plate in such a manner as to arrange the substrates vertically at predetermined intervals;
   an elevator mechanism which moves the cover up and down to load the holder into and unload the holder from the thermal reactor;
   a storage container which is positioned outside the thermal reactor to store a plurality of to-be-processed substrates at predetermined intervals; and
   a transfer mechanism which has a plurality of transfer plates that are arranged at predetermined intervals to carry to-be-processed substrates thereon, the transfer mechanism transferring the to-be-processed substrates between the storage container and the holder;
   wherein the support plate for the holder is divided into a support plate main body and a block plate which are formed separately from each other, the main body being formed substantially C-shaped having a cutout section through which the transfer plates can vertically pass to transfer the to-be-processed substrates, the block plate blocking up the cutout section of the support plate main body.

* * * * *